United States Patent
Zou

(10) Patent No.: US 10,935,999 B2
(45) Date of Patent: Mar. 2, 2021

(54) LOAD LINE CIRCUIT FOR VOLTAGE REGULATORS

(71) Applicant: SEMICONDUCTOR COMPONENTS INDUSTRIES, LLC, Phoenix, AZ (US)

(72) Inventor: Han Zou, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/661,825

(22) Filed: Oct. 23, 2019

(65) Prior Publication Data

US 2021/0034084 A1 Feb. 4, 2021

Related U.S. Application Data

(60) Provisional application No. 62/881,642, filed on Aug. 1, 2019.

(51) Int. Cl.
*G05F 1/00* (2006.01)
*G05F 1/56* (2006.01)
*G06F 1/26* (2006.01)
*H03F 3/45* (2006.01)

(52) U.S. Cl.
CPC .............. *G05F 1/56* (2013.01); *G06F 1/26* (2013.01); *H03F 3/45475* (2013.01); *H03F 3/45973* (2013.01)

(58) Field of Classification Search
CPC ..... G05F 1/56; H03F 3/45973; H03F 3/45475; G06F 1/26
See application file for complete search history.

(56) References Cited

U.S. PATENT DOCUMENTS

| | | | |
|---|---|---|---|
| 9,130,448 B2 * | 9/2015 | Hu | H02M 7/02 |
| 2005/0077883 A1 * | 4/2005 | Walters | H02M 3/156 |
| | | | 323/273 |
| 2008/0122412 A1 | 5/2008 | Burton et al. | |
| 2015/0076902 A1 * | 3/2015 | Zou | H02J 7/02 |
| | | | 307/23 |

* cited by examiner

*Primary Examiner* — Adolf D Berhane
*Assistant Examiner* — Afework S Demisse
(74) *Attorney, Agent, or Firm* — Brake Hughes Bellermann LLP

(57) ABSTRACT

A voltage regulator with a load line circuit is disclosed. The load line circuit is configured to receive a sensed voltage corresponding to an output current of the voltage regulator. The load line circuit is further configured to generate a complex (e.g., nonlinear) load line voltage that is combined with the output voltage of the voltage regulator and compared with a set voltage of the voltage regulator to produce an error signal. The error signal is used as feedback for the voltage regulator so that the output voltage of the voltage regulator can droop by a particular amount corresponding to a particular output current of the voltage regulator. The disclosed analog approach requires neither clock signals nor digital circuitry and utilizes a parallel topology that allows the disclosed approach to be fast and energy efficient.

20 Claims, 8 Drawing Sheets

LOAD LINE CIRCUIT FOR VOLTAGE REGULATORS

CROSS-REFERENCE TO RELATED APPLICATIONS

This application claims the benefit of U.S. Provisional Patent Application No. 62/881,642, filed on Aug. 1, 2019, the entire contents of which is incorporated herein by reference.

FIELD OF THE DISCLOSURE

The present disclosure relates to DC power supplies and more specifically to a voltage regulator with an analog feedback system that enables a fast, non-linear load-line response to a change in load conditions.

BACKGROUND

High performance computing processors, graphic processors, artificial intelligence (AI) processors, and automotive electronic systems may require added power occasionally in response to an increased performance requirement (i.e., heavy load). For example, a processor may trigger a voltage regulator module or power supply (i.e., a core power regulator) to increase the power delivered to the processor. Core power regulators must satisfy the additional power requirements while providing protection against over-temperature, overcurrent, and over/under voltage. Part of this protection may include a voltage droop.

A voltage droop is a core power regulator's reduction of its output voltage as its output (i.e. load) current increases. The prescribed output voltage versus output current profile of the voltage droop is known as a load line. Core power regulators with circuitry to apply a load line can be used to control an output voltage swing so that it remains within designated boundaries, especially during heavy loads.

In some implementations, a load line has a constant (voltage versus current) slope. The simplicity of the constant slope load line may minimize processing requirements and can improve a speed at which a regulator can respond to changing load conditions. In some implementations however, it may be desirable for the load line to match (or approximate) a more complicated profile. Digital processing approaches to produce the complicated profile may add complexity and reduce a speed at which a load line is applied to a regulator's output. A need, therefore, exists for circuits and methods to implement more complicated load lines that provide speed complexity, processing, and power advantages.

SUMMARY

In at least one aspect, the present disclosure generally describes a voltage regulator. The voltage regulator includes a load line circuit that is configured to receive a sensed voltage corresponding to an output current of the voltage regulator. Based on the sensed voltage, a load-line voltage is generated. When the load-line voltage is added to an error signal of the voltage regulator an output voltage of the voltage regulator is caused to follow a load line. The load line circuit includes a plurality of amplifiers that are each configured to amplify the sensed voltage with a gain to form different slopes of the load line. The load line circuit also includes a plurality of limiters. Each limiter is configured to clamp signals in the load line circuit to form inflection points at the boundaries of portions of the load line.

In another aspect, the present disclosure generally describes a method for implementing a load line in a voltage regulator. In the method, a sensed voltage corresponding to an output current of the voltage regulator is received simultaneously at a first amplifier having a first gain and at a second amplifier having a second gain. The sensed voltage is amplified with the first amplifier to output a first slope-component signal. The sensed voltage is also amplified with the second amplifier to output a second slope-component signal. A first limiter is used to clamp the second slope-component signal to a voltage corresponding to a mid-inflection point of the load line when the sensed voltage is above a threshold corresponding to a mid-inflection point, otherwise the second slope-component signal is not clamped by the first limiter. The first slope-component signal and the second slope-component signal are then summed to form a load-line voltage. A second limiter is used to clamp the load-line voltage to a voltage corresponding to a minimum voltage of the load line when the sensed voltage is above a high-inflection point, otherwise the load-line voltage is not clamped by the second limiter. A third limiter is used to clamp the load-line voltage to zero volts when the sensed voltage is below a low-inflection point, otherwise the load-line voltage is not clamped by the third limiter.

In another aspect, the present disclosure generally describes a load line circuit for a voltage regulator. The load line circuit includes a plurality of slope circuits that are coupled in parallel to simultaneously receive a sensed voltage corresponding to an output current of the voltage regulator. Each slope circuit includes an amplifier having a gain, and the plurality of the slope circuits are configured to output a plurality of slope-component voltages. The load line circuit also includes a summing circuit that adds the plurality of slope-component voltages and outputs a sum voltage. The load line circuit also includes a plurality of limiters that limit one or more of the plurality of slope component voltages or the sum voltage. Each limiter is configured to clamp a voltage to a fixed value when a threshold condition for each limiter is met so that an output of the load line circuit is a load line voltage having a plurality of portions. Each portion has a slope or is a constant voltage that corresponds to a load line for the voltage regulator.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

The present disclosure describes circuits and methods to implement a load line in voltage regulation. The disclosed approach can produce complex load line profiles without the need for digital processing or state machine logic, which could slow a response time (e.g., to a changing load current) and which could consume additional power.

The disclosed circuits and methods may be used in voltage regulation to reduce transients on energy storage components resulting from changes to output (i.e., load) current. Additionally, the disclosure circuits and methods may be used in voltage regulation to maintain temperatures resulting from power dissipation within a safe thermal range. For example, by using the disclosed circuits and methods, high power may be delivered to core processors, graphic processor units, parallel computing, and/or artificial intelligence processors while providing over temperature, over current, and over/under voltage protection.

The disclosed circuits and methods may be used with any type of voltage regulator and is well suited for a boost or buck power converter switched by a driver circuit that is controlled by a pulse width modulator (PWM) controller. The voltage is regulated by the duty cycle of a regulation signal output from the PWM controller. In implementations where a high current is required the described regulator may include multiple phases each producing the regulated voltage and that are all coupled together to provide the regulated voltage at a current that is the sum of the phases. Accordingly, the voltage regulator may be a single-phase voltage regulator or a multi-phase voltage regulator. In one example implementation, the voltage regulator may be part of a power supply and can provide regulated voltage from a connection to grid power (i.e., wall power). In another example implementation the voltage regulator may be part of core voltage regulation for an automotive electronic system.

Figure 1:
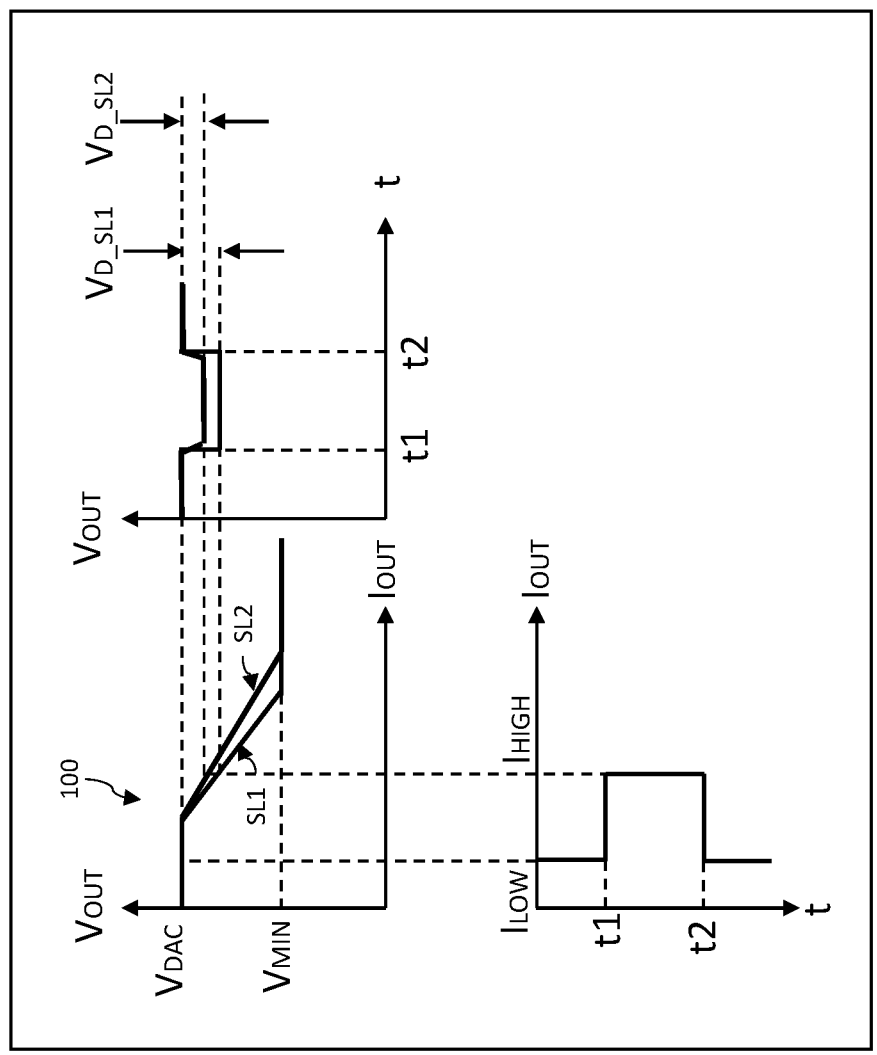
FIG. 1 includes graphs that generally depict the effect of a load line on an output voltage.

A voltage regulator provides, at its output, an output voltage ($V_{OUT}$) and an output (i.e., load) current ($I_{OUT}$). In a steady state, the voltage regulator (i.e., regulator) operates to make $V_{OUT}$ equal to a set voltage ($V_{DAC}$) of the regulator. In voltage regulators with a load line response, $V_{OUT}$ is lowered from $V_{DAC}$ when the $I_{OUT}$ drawn by the load is increased above a value (i.e., threshold). FIG. 1 illustrates two load lines ($V_{OUT}$ vs. $I_{OUT}$) and their corresponding effect on $V_{OUT}$ as a result of $I_{OUT}$ changing from a low current ($I_{LOW}$) to a high current ($I_{HIGH}$).

A load line 100 is a graph (i.e., profile, plot) of the output voltage ($V_{OUT}$) of versus the output current ($I_{OUT}$). In FIG. 1, each load line drops linearly from $V_{DAC}$ to a minimum output voltage of the regulator ($V_{MIN}$) as $I_{OUT}$ is increased. A first load line has a fast slope ($SL_1$) and a second load line has a slow slope ($SL_2$). The fast slope of the fast load line is not fast in a temporal sense but rather in the sense that it has a faster decent from $V_{DAC}$ to $V_{MIN}$ as $I_{OUT}$ is increased than the slow load line. The slope of the load line affects a voltage droop of $V_{OUT}$. The fast load line produces a fast-load-line voltage droop ($V_{D\_SL1}$) that is larger than the slow-load-line voltage drop ($V_{D\_SL2}$). As shown in FIG. 1, before a first time ($t_1$), $V_{OUT}$ equals $V_{DAC}$ according to the load line 100 (i.e., no voltage droop). At time t1, $I_{OUT}$ transitions from Low to $I_{HIGH}$. The load line 100 may be used to determine the corresponding voltage droop in the high current condition. At time t2, $I_{OUT}$ transitions form $I_{HIGH}$ back to Low. As before, the load line 100 may be used to determine $V_{OUT}$ as $V_{DAC}$ (i.e., no load line adjustment).

In some implementations it is desirable to have a load line with a profile that is more complex than the linear decrease of FIG. 1. For example, a load line that decreases from $V_{DAC}$ to $V_{MIN}$ along a nonlinear (e.g., parabolic, exponential, etc.) profile may be desirable for some applications. For example, the nonlinear profile of the load line may produce a voltage droop that initially increases quickly (i.e., fast) as $I_{OUT}$ crosses a threshold but that increases at a slower rate as $I_{OUT}$ is increased further. A nonlinear load line portion may allow a voltage regulator to deliver maximum power to a component (e.g., a processor) without overheating the component. Additionally, a voltage regulator implementing a load line that has a nonlinear profile may output a constant power as $I_{OUT}$ is changed (i.e., increased).

Figure 2:
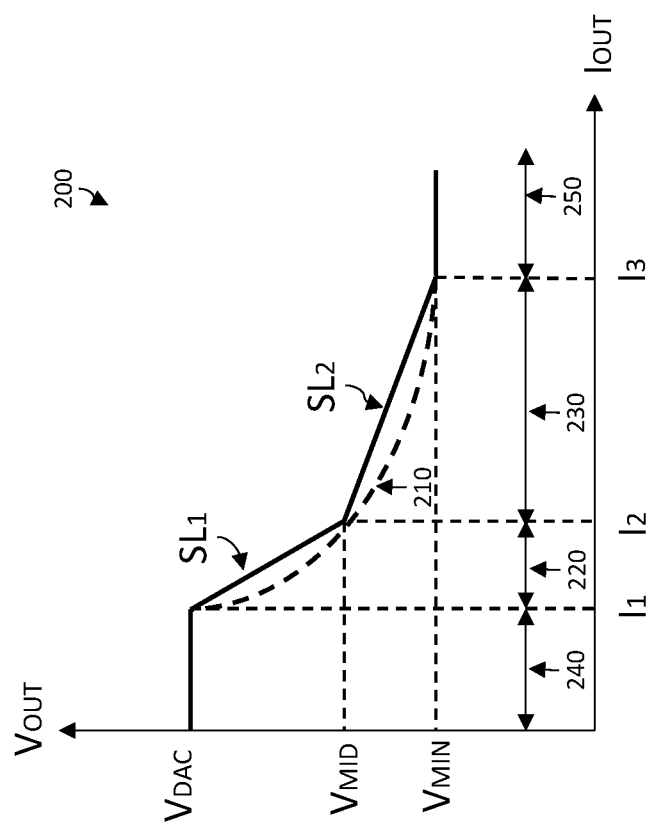
FIG. 2 is a graph of a load line having a profile that includes a fast-slope portion and a slow-slope portion to approximate a constant power profile.

FIG. 2 illustrates a load line with a nonlinear profile 210. For this load line, $V_{OUT}$ decreases nonlinearly from $V_{DAC}$ to $V_{MIN}$ as $I_{OUT}$ is increased from $I_1$ to $I_3$. Implementing a nonlinear load line may not be power or processing efficient. The present disclosure recognizes that an approximation of a nonlinear profile of a load line may be sufficient to satisfy the power and safety considerations described above.

FIG. 2 also illustrates a possible load line implementation that has a first portion 220 and a second portion 230 to approximate the nonlinear profile 210. The first slope portion 220 decreases from $V_{DAC}$ to a middle voltage $V_{MID}$ according to a first slope ($SL_1$) as $I_{OUT}$ is increased from $I_1$ to $I_2$. The second slope portion 230 decreases from $V_{MID}$ to $V_{MIN}$ according to a second slope ($SL_2$) as $I_{OUT}$ is increased from 12 to 13. As shown, $SL_1$ decreases at a faster rate (i.e., has a larger negative slope) than $SL_2$. The load line also includes a first constant portion 240 that is a constant voltage (i.e. $V_{DAC}$) for $I_{OUT} \leq I_1$. The first constant portion 240 applies to load currents sufficiently low (i.e., below $I_1$) so that no voltage droop is necessary. In this portion, the output of the output voltage of the regulator ($V_{OUT}$) is nominally the set voltage ($V_{DAC}$). The load line also includes a second constant portion 250 that is a constant voltage (i.e. $V_{MIN}$) for $I_{OUT} \geq I_3$. The second constant portion 250 applies to load currents sufficiently high (i.e., below $I_3$) so that a maximum voltage droop is necessary. For these currents, the output of the regulator is fixed at a minimum value to insure proper operation of connected devices. In some implementations, however, the load line 200 may include an additional portion (not shown) for $I_{OUT} \gg I_3$ in which $V_{OUT}$ is further reduced (e.g., along a steep slope) to prevent damage to the voltage regulator in conditions of extremely high load currents.

Figure 3:
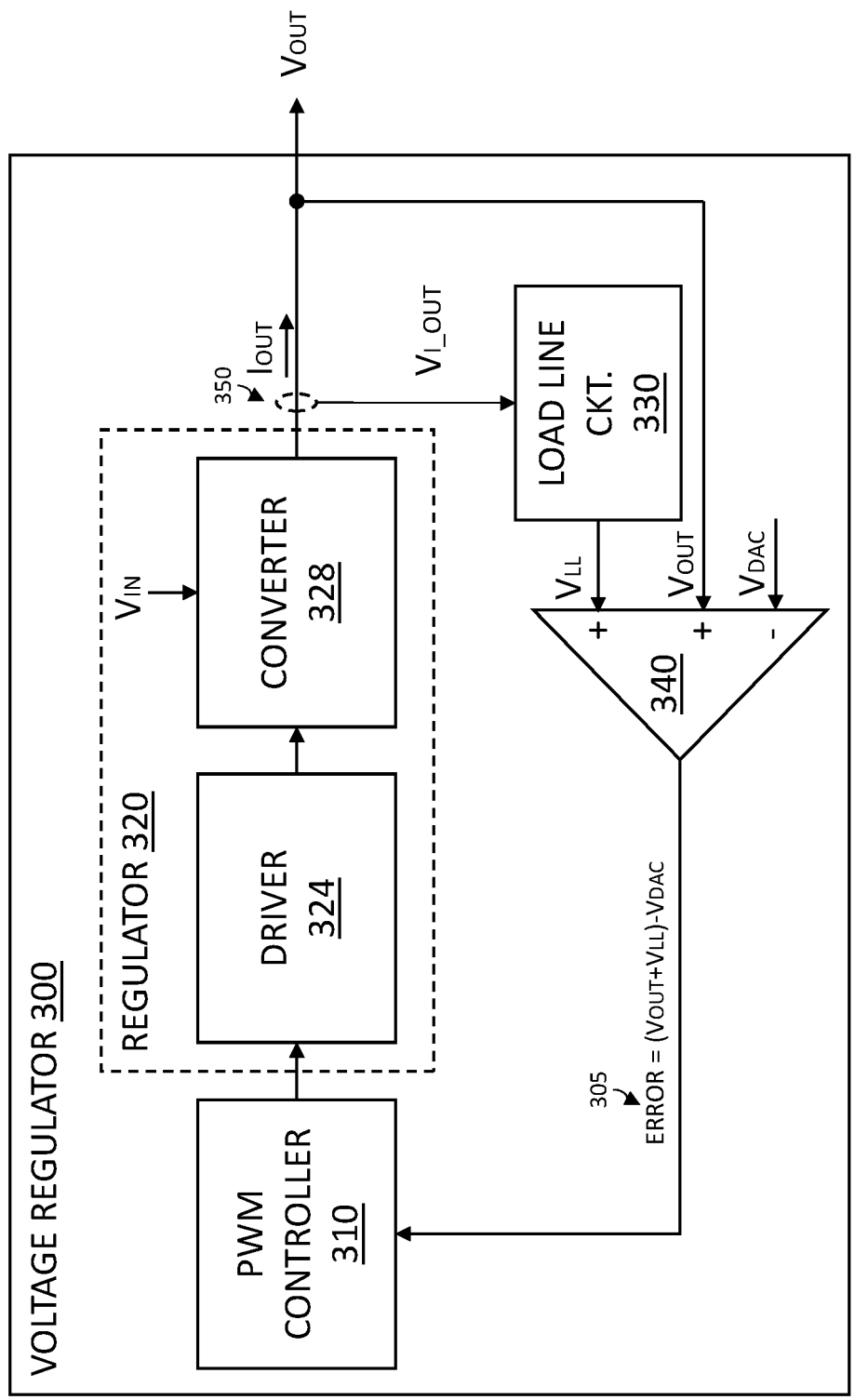
FIG. 3 is system block diagram of a voltage regulator according to a possible implementation of the present disclosure.

FIG. 3 is system block diagram of a voltage regulator according to a possible implementation of the present disclosure. The voltage regulator 300 (e.g., core power regulator) includes a regulator circuit 320 (i.e., regulator module) in which a converter circuit (i.e., converter) 328 is controlled (i.e., switched) by a driver circuit (i.e., driver) 324. The converter circuit may be a DC-DC power converter, such as a buck (i.e., step-down) or a boost (i.e., step-up) converter. The converter 328 may include one or more energy storage elements (e.g., capacitor, inductor) that are periodically coupled (i.e., switched) to an input voltage ($V_{IN}$) by one or more switching devices (e.g., transistors). The controlling terminals (e.g., gate terminals) of the switching devices are driven by signals from the driver 324 to periodically turn the switching devices ON/OFF. Qualities of the periodicity of the switching are determined by a pulse width modulator controller circuit (i.e., PWM controller) 310. The PWM controller 310 can be configured to output a periodic signal with a duty cycle that is determined by an error signal (ERROR) 305 based on a set voltage $V_{DAC}$ and an output voltage ($V_{OUT}$) of the voltage regulator. For example, the PWM controller may adjust a duty cycle at which the switching devices of the converter 328 are turned ON/OFF in order to minimize (e.g., make zero) the error signal 305.

The error signal (ERROR) for the voltage regulator 300 of FIG. 3 is determined by a difference (i.e., differential) amplifier 340 that receives an output voltage of the regulator ($V_{OUT}$), a set voltage of the voltage regulator ($V_{DAC}$) and a load line voltage ($V_{LL}$). The difference amplifier 340 is configured to generate an error signal according to the equation (i.e., equation 1) below.

$$\text{ERROR}=(V_{out}+V_{LL})-V_{DAC} \quad (1)$$

Accordingly, when the error signal is made zero by the output voltage is given by the equation (i.e., equation 2) below.

$$V_{OUT}=V_{DAC}-V_{LL} \quad (2)$$

Based on the equation above, the load line voltage ($V_{LL}$) may be seen as adjusting the error signal 305 so that the output voltage ($V_{OUT}$) is reduced. In other words, the differential amplifier 340 can be configured to compare the output voltage to the set voltage in order to generate a first error signal (i.e., $V_{OUT}-V_{DAC}$). The load line voltage can be added to the first error signal so that the PWM controller 310 receives the first error signal plus the load line voltage (i.e., $(V_{OUT}-V_{DAC})+V_{LL}$) as the error signal 305 for controlling the output voltage. Thus, a zero load line voltage does not affect the output voltage of the regulator, which is regulated to the set voltage. As the load line voltage is increased, however, the output voltage is reduced, and the larger the load line voltage the more the output voltage is reduced from the set voltage.

The load line voltage ($V_{LL}$) is based on the output (i.e., load) current ($I_{OUT}$) of the voltage regulator. The voltage regulator 300 includes a load line circuit 330 that is configured to sense the output current ($I_{OUT}$). Based on the sensed output current, the load line circuit 330 generates a load line voltage ($V_{LL}$) that is adds to the error signal (i.e., see equation 1) in such a way that as to adjust the output voltage of the voltage regulator 300 according to a load line profile (i.e., load line), such as shown in FIG. 2.

The load line voltage generated by the load line circuit may correspond to a complex load line profile. The complex load line profile is generated without the need of a digital processor (i.e., controller) to perform a look-up of the load line voltage based on a sensed load current or a state machine that determines a state corresponding to the sensed load current and then outputs a load line voltage based on the determined state. Instead, the disclosed load line circuit may determine a load line based on analog circuitry. As a result, the disclosed load line circuitry may be faster, less complicated, and require less power than these alternatives (e.g., digital alternatives).

The load line circuit may be configured to receive a sensed voltage ($V_{I\_OUT}$) that corresponds to the output current of the voltage regulator 300. Accordingly, the voltage regulator may include a sensor 350 to convert (i.e., transduce) the output current ($I_{OUT}$) into the sensed voltage ($V_{I\_OUT}$). An input to the load line circuit may be coupled to the output of the sensor 350.

Figure 4:
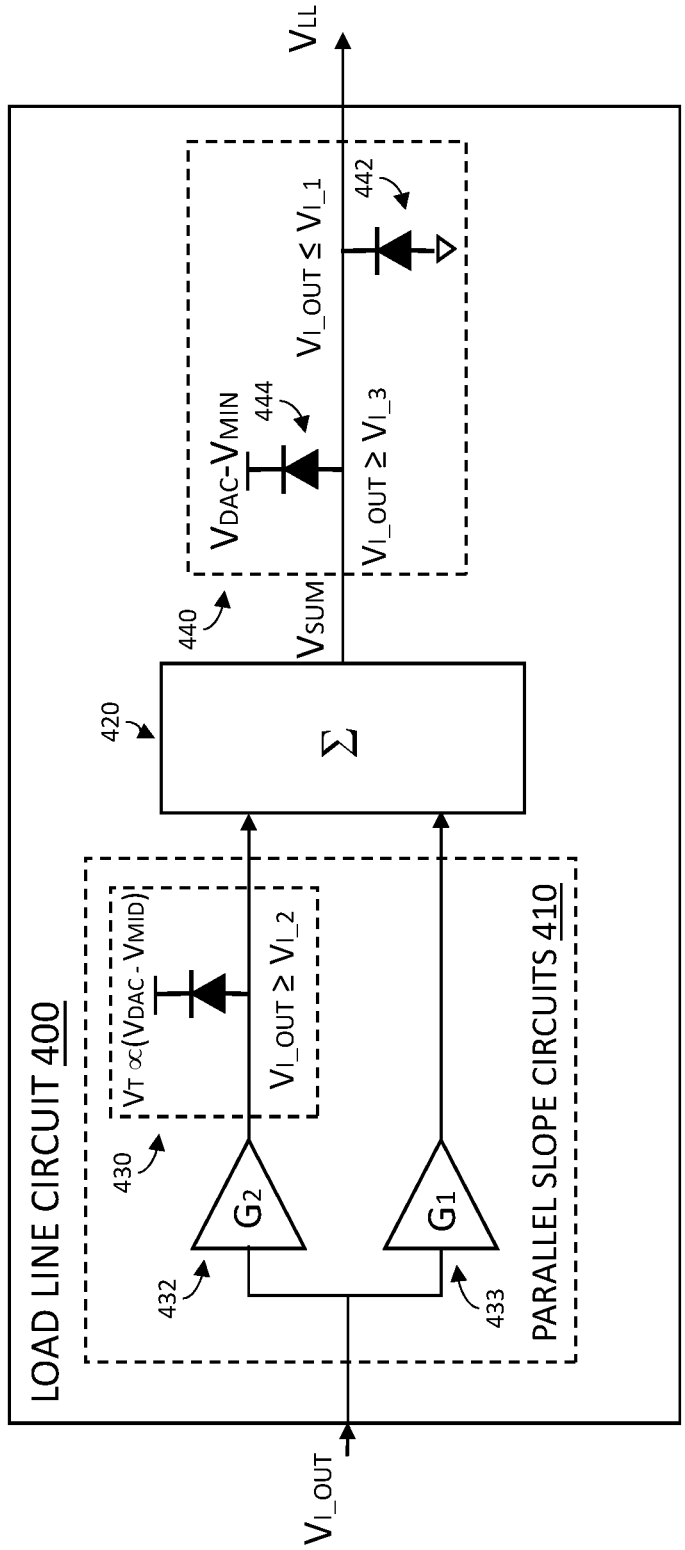
FIG. 4 is a block diagram of a load line circuit according to one possible implementation of the present disclosure.

FIG. 4 is a block diagram of a load line circuit 400 according to a possible implementation of the present disclosure. The load line circuit 400 receives a sensed voltage ($V_{I\_OUT}$) corresponding to the output current ($I_{OUT}$) of a voltage regulator. For example, $V_{I\_OUT}$ may be related to $I_{OUT}$ by the following equation.

$$V_{I\_OUT}=K \cdot I_{OUT} \quad (3)$$

In order to generate a complex load line profile, the load line circuit 400 includes a plurality of slope circuits that are connected in parallel to receive $V_{I\_OUT}$. Each of the parallel slope circuits includes an amplifier having a gain, and each amplifier outputs a slope-component signal (e.g., voltage). The gain (e.g., G1, G2) of each of amplifier corresponds to a rate at which a slope-component signal changes with respect to the sensed voltage. When the outputs of the amplifiers are not limited (i.e., clamped), the slope-component signals of all the amplifiers contribute to the slope of the load-line voltage when summed. When the output of some of the amplifiers are limited only those amplifiers that are not limited (i.e., to a fixed value) contribute to the slope of the load-line voltage when summed. Accordingly, the outputs of the parallel slope circuits 410 are input to a summing circuit 420 that adds the plurality of slope-component voltages and outputs a sum voltage.

The load line circuit 400 also includes a plurality of limiters. The limiters may be implemented as diodes or switches that can be configured to clamp a portion (i.e., a node) of the load line circuit to a fixed level (e.g., voltage level) when a threshold condition is met. The threshold conditions and the clamped voltage levels of the limiters may be selected based on a desired load line profile. For example, the load line of FIG. 2 has three threshold conditions: $I_1$, $I_2$, and $I_3$ that create four distinct portions each having a corresponding constant voltage or sloped voltage.

The plurality of limiters may include a slope limiter 430. The slope limiter 430 is coupled to a slope circuit. In particular, the slope limiter 430 is coupled to the output of the $G_2$ amplifier 432 of the slope circuit. When threshold condition is met, the slope limiter clamps the output of the $G_2$ amplifier 432 to a fixed voltage so that the slope-component voltage of the slope circuit is a constant value.

As shown in FIG. 4, when the sensed voltage ($V_{I\_OUT}$) is greater than or equal to a threshold level voltage ($V_{I\_2}$), the slope limiter 430 clamps the voltage output to a fixed value $V_T$. The threshold voltage corresponds to a mid-inflection point of a load line. A mid-inflection point is a sensed voltage at which a slope of the load line changes its rate of change (i.e., slope). The clamped output of the limiter is a voltage $V_T$ that is proportional a voltage corresponding to the mid-inflection point (i.e., $V_{DAC}-V_{MID}$). When the sensed voltage is less than the mid inflection point (i.e., $V_{I\_OUT}<V_{I\_2}$) then both slope circuits output a slope-component that changes with respect to $V_{I\_OUT}$. When the sensed voltage is equal to or above the threshold level voltage (i.e., $V_{I\_OUT} \geq V_{I\_2}$), only the non-limited slope circuit (i.e., G1 amplifier 433) outputs a slope-component voltage that changes with respect to $V_{I\_OUT}$. Accordingly, below the threshold the sum voltage has a larger (i.e., faster) slope than above the threshold.

The plurality of limiters may also include a sum limiter 440. The sum limiter receives the sum voltage $V_{SUM}$ and is configured to limit or pass the sum voltage to the output of the load line circuit (i.e., as $V_{LL}$) based on two threshold conditions. The two threshold conditions correspond to a minimum inflection point ($V_{I\_1}$) and a maximum inflection point ($V_{I\_OUT}=V_{I\_3}$). When the sensed voltage is at or below the minimum inflection point ($V_{I\_OUT} \le V_{I\_1}$) then $V_{LL}$ is clamped at a (minimum) ground voltage (e.g., zero volts). When the sensed voltage is at or above the maximum inflection point (i.e., $V_{I\_OUT} \ge V_{I\_3}$) then $V_{LL}$ is clamped at a (maximum) voltage, $V_{DAC}-V_{MIN}$. When the sensed voltage is in between these (maximum/minimum) threshold conditions, the sum limiter 440 has no significant effect and simply passes $V_{SUM}$ to the output as $V_{LL}$. In this condition, the slope of $V_{LL}$ is affected by the slope limiter 430, as described previously.

Figure 5:
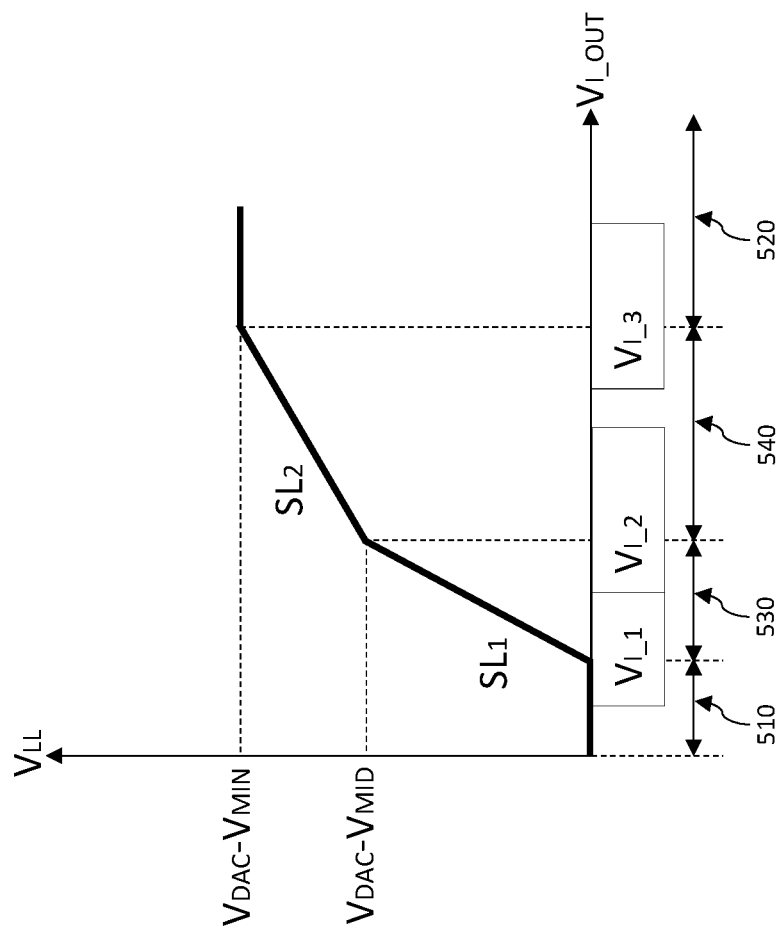
FIG. 5 is a graph of a possible load line voltage output from the load line circuit of FIG. 4.

FIG. 5 is a graph showing possible load line voltages ($V_{LL}$) that can be output from the load line circuit 330 versus a range of sensed voltages ($V_{I\_OUT}$) of FIG. 4. As shown, the profile of $V_{LL}$ includes four portions. A zero portion 510 includes voltages of $V_{I\_OUT}$ less than a minimum inflection point $V_{I\_1}$. The load line circuit outputs zero volts (i.e., $V_{LL}=0$) for all $V_{I\_OUT}$ in a minimum portion 510. In other words, the voltage regulator is not affected by the load line for sensed voltages in the minimum portion (i.e., $0 \le V_{I\_OUT} \le V_{I\_1}$). A constant-voltage portion 520 includes voltage of $V_{I\_OUT}$ greater than a maximum inflection point $V_{I\_3}$. The load line circuit 400 outputs a fixed (i.e., constant) voltage equivalent to a minimum voltage $V_{MIN}$ subtracted from the set voltage $V_{DAC}$ (i.e., $V_{LL}=V_{DAC}-V_{MIN}$) for sensed voltages in the constant-voltage portion (i.e., $V_{I\_3} \le V_{I\_OUT}$). The zero portion 510 and the constant-voltage portion 520 are controlled by a minimum limiter 442 and a maximum limiter 444 of the sum limiter 440, respectively. For sensed voltages ($V_{I\_OUT}$) between the zero portion 510 and the constant-voltage portion 520, the sum limiter has no significant effect on $V_{LL}$.

The profile of $V_{LL}$ includes a fast slope portion 530. In the fast slope portion (i.e., $V_{I\_1} \le V_{I\_OUT} \le V_{I\_2}$), the rate (i.e., slope) at which the load line voltage changes versus the sensed voltage is $SL_1$. In the fast slope portion 530, the slope limiter 430 is does not limit the slope component from the $G_2$ amplifier 432. Accordingly, $V_{LL}$ grows (versus $V_{I\_OUT}$) according to slope component contributions from the $G_1$ amplifier 433 and from the $G_2$ amplifier 432.

The profile of $V_{LL}$ also includes a slow slope portion 540. In the slow slope portion (i.e., $V_{I\_2} \le V_{I\_OUT} \le V_{I\_3}$), the rate (i.e., slope) at which the load line voltage changes versus the sensed voltage is $SL_2$ and determined by the slope limiter 430. In the slow slope portion 540, the slope limiter 430 limits the slope component from the $G_2$ amplifier 432 to a constant value. Accordingly, $V_{LL}$ grows (versus $V_{I\_OUT}$) according to only the slope component contribution from the $G_1$ amplifier 433. As a result, the slope in the slope portion 540 is less than the slope in the fast slope portion. The constant value ($V_T$) to which the slope component is clamped may be adjusted to provide a slope so that the profile of the load line voltage matches a desired profile, such as a constant power curve. In one possible implementation, $V_T$ may be proportional the set voltage minus a mid-inflection point voltage (i.e., $V_{DAC}-V_{MID}$). For example, $V_T=(V_{DAC}-V_{MID})\cdot(SL_1-SL_2)/SL_1$.

The graph in FIG. 5 showing possible load line voltages ($V_{LL}$) relates to the load line of the voltage regulator (see FIG. 2) through equation (2). The result of a minimization (i.e., zeroing) of an error signal 305 (e.g., ERROR=0) is $V_{OUT}=V_{DAC}-V_{LL}$, so as $V_{LL}$ is increased (versus the sensed voltage) $V_{OUT}$ is decreased. In other words, as the output current ($I_{OUT}$) of the voltage regulator 300 is increased, a load line voltage ($V_{LL}$) can be made larger to reduce the output voltage ($V_{OUT}$) of the voltage regulator.

Figure 6:
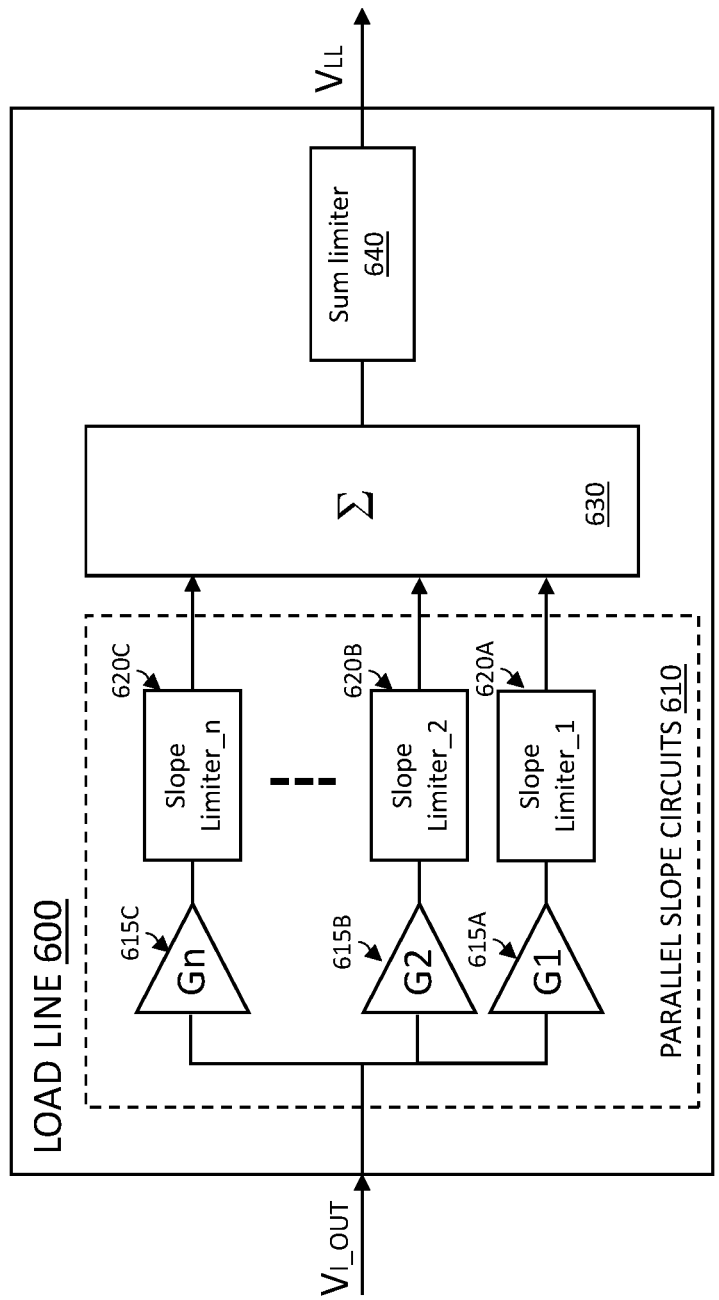
FIG. 6 is a generalized block diagram of a load line circuit illustrating a variety of possible implementations of the present disclosure.

FIG. 6 illustrates a block diagram of a generalized load line circuit 600 according an implementation of the present disclosure. In addition to a summing circuit 630 and a sum limiter 640, the load line circuit 600 includes a plurality of parallel slope circuits 610. Each slope circuit includes an amplifier 615A, 615B, 615C and a slope limiter 620A, 620B, 620C. Each slope circuit can be configured with a particular gain, a particular limiter threshold, and a particular limiter voltage to provide a variety of possible profiles for a load line voltage ($V_{LL}$) versus a sensed voltage. A profile resulting from the load line circuit of FIG. 6 may include a number of portions that corresponds to the number (n) of parallel slope circuits. Accordingly, load line voltage profiles can better approximate a complex profile when the number of parallel slope circuits is increased. One advantage of the disclosed load line circuit approach is an increase in a number of parallel slope circuits does not increase the throughput time of the circuit because they operate in parallel. Accordingly, complex load line voltage profiles (versus a sensed voltage corresponding to the output current) may be generated very quickly (e.g., in real time). Additionally, a load line voltage profile may be adjusted by adjusting the parameters of the parallel slope circuits 610 described above.

Figure 7:
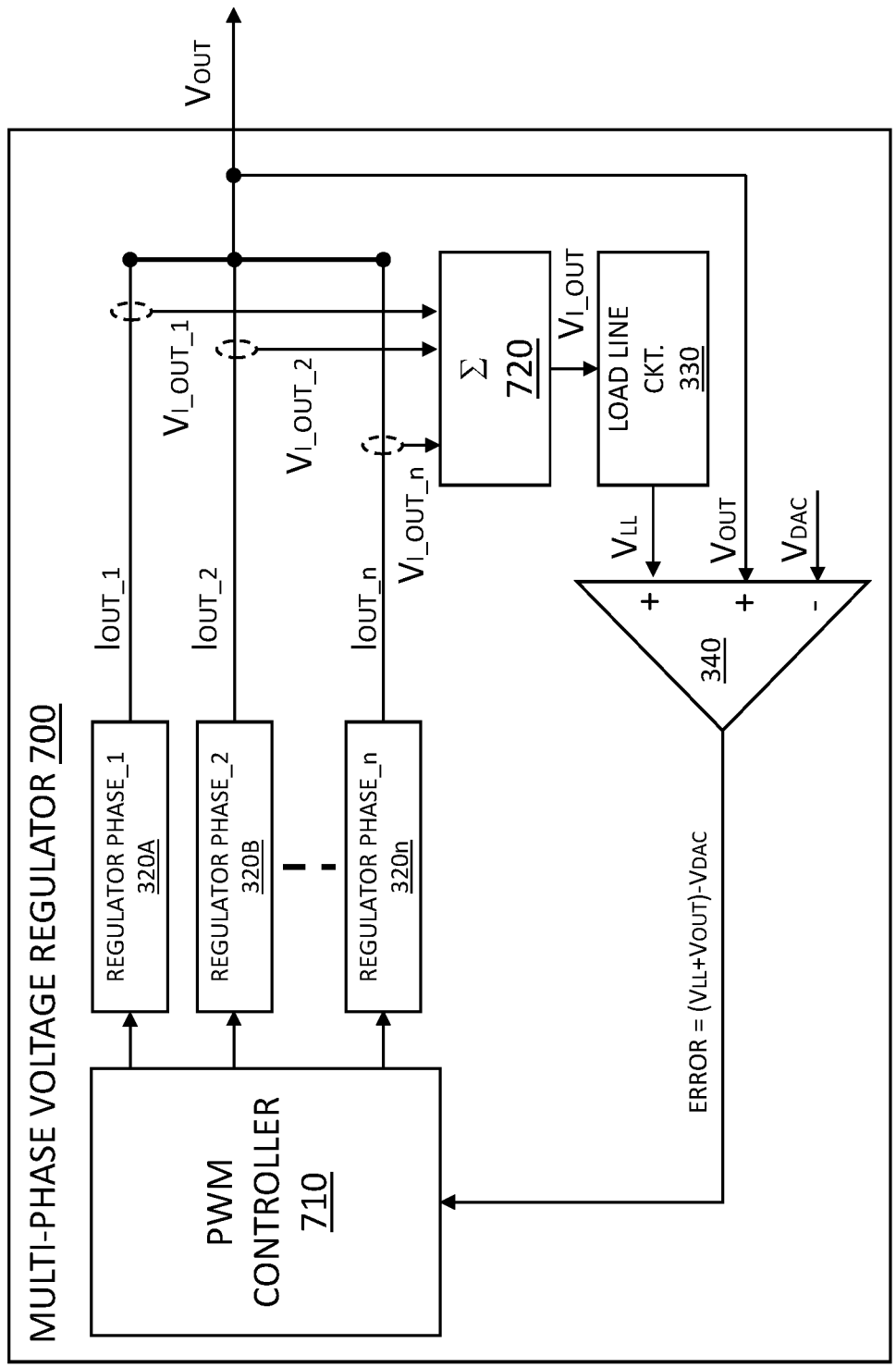
FIG. 7 is a block diagram of a multi-phase voltage regulator according to one possible implementation of the present disclosure.

The disclosed circuits and techniques may be applied to multi-phase voltage regulators. FIG. 7 is a block diagram of a multi-phase voltage regulator (i.e., multi-phase regulator) 700 according to one possible implementation of the present disclosure. The multi-phase regulator includes a PWM controller 710 that controls a regulator circuits 320A, 320B, 320n for each phase. Each regulator circuit outputs $V_{OUT}$ and each regulator circuit provides a phase current $I_{OUT\_1}$, $I_{OUT\_2}$, $I_{OUT\_n}$. Each phase current can be sensed by a sensor to provide a phase-sensed voltage for the phase $V_{I\_OuT\_1}$, $V_{I\_OUT\_2}$, $V_{I\_OuT\_n}$. The sensed voltage may be summed by a phase summer circuit (i.e., phase summer) 720 to produce the sensed voltage $V_{I\_OUT}$ for the load line circuit 330 as described previously. The load line circuit 330 produces a load line voltage that is applied with the output voltage ($V_{OUT}$) and the set voltage ($V_{DAC}$) to a differential (i.e., difference) amplifier 340 to produce the error signal (ERROR), which is minimized by adjusting the pulse width of signals output by the PWM controller 710.

Figure 8:
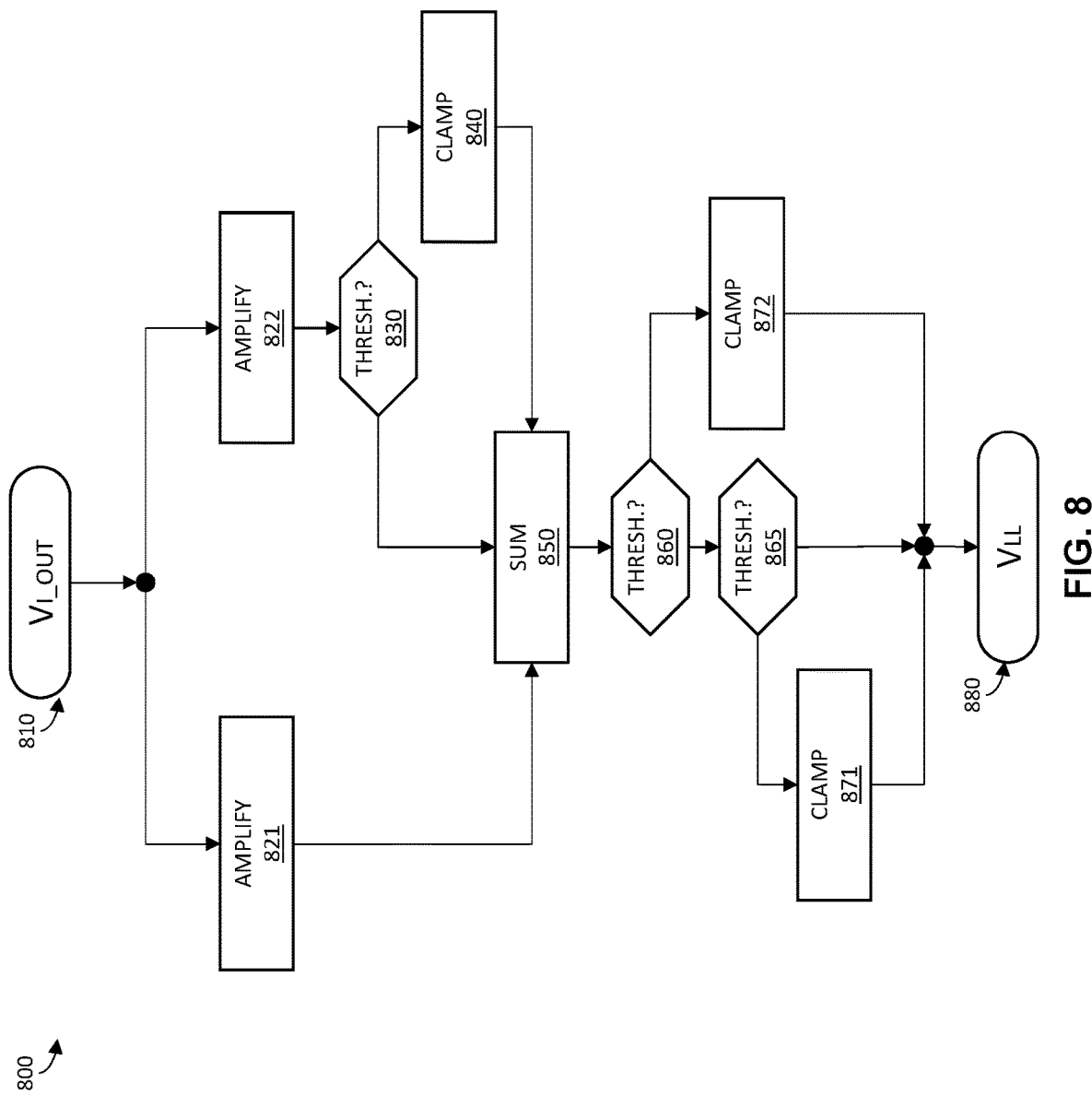
FIG. 8 is a flow chart of a method for implementing a load line in a voltage regulator to a possible implementation of the present disclosure.

A flowchart of a possible method for implementing a load line in a voltage regulator is shown in FIG. 8. In the method 800, a sensed voltage 810 corresponding to an output current of a voltage regulator is simultaneously received at a first amplifier and a second amplifier. The first amplifier amplifies 821 the sensed voltage to output a first slope-component signal. The second amplifier amplifies 822 the sensed voltage to output a second slope-component signal. The second slope-component signal is compared to a first threshold 830. Based on the comparison (e.g., second slope-component signal above the threshold), the second slope component signal is either (i) clamped 840 (e.g., by a first limiter) to a fixed (i.e., constant voltage) and passed to a summer or (ii) is passed directly to the summer. Additionally, the first slope-component signal is passed to the summer. The signals input to the summer are summed 850. The summed signal is then compared to a second threshold 860 (e.g., corresponding to a high-inflection point or a maximum). Based on the comparison (e.g., the summed signal is greater than the second threshold), the summed signal is either clamped 872 (e.g., by a second limiter) to a constant voltage (e.g., maximum $V_{LL}$) before being passed to an output as the load line voltage or (ii) is passed directly to a third threshold comparison 865. When passed to the third threshold comparison, the summed signal is compared to the third threshold 865 (e.g., corresponding to a low-inflection point or a minimum). Based on the comparison (e.g., the summed signal is less than the third threshold), the summed signal is either (i) clamped 871 (e.g., by a third limiter) to a constant voltage (e.g., minimum $V_{LL}$) before being passed to an output as the load line voltage or (ii) is or passed directly to an output 880 as the load line voltage.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A voltage regulator, comprising:
   a load line circuit configured to receive a sensed voltage corresponding to an output current of the voltage regulator and, based on the sensed voltage, to generate a load-line voltage that when added to an error signal of the voltage regulator causes an output voltage of the voltage regulator to follow a load line, the load line circuit including:
   a plurality of amplifiers each amplifier configured to amplify the sensed voltage with a gain to form different slopes of the load line; and
   a plurality of limiters, each limiter configured to clamp signals in the load line circuit to form inflection points at boundaries of portions of the load line.

2. The voltage regulator according to claim 1, further comprising:
   a differential amplifier configured to compare the output voltage to a set voltage in order to generate the error signal; and
   a pulse-width-modulation (PWM) controller configured to control a regulator circuit to adjust the output voltage based on the error signal.

3. The voltage regulator according to claim 2, further comprising:
   additional regulator circuits controlled by the PWM controller, the regulator circuit and the additional regulator circuits operating as phases of a multi-phase regulator; and
   a phase summer configured to receive phase-sensed voltages corresponding to output currents of each phase of the multi-phase regulator and to output a sum of the phase-sensed voltages to the load line circuit.

4. The voltage regulator according to claim 1, wherein the load line circuit further comprises a summing circuit receiving outputs from the plurality of amplifiers.

5. The voltage regulator according to claim 4, wherein the plurality of amplifiers are coupled in parallel so that each amplifier input receives the sensed voltage and so that each amplifier output is coupled to the summing circuit.

6. The voltage regulator according to claim 1, wherein the plurality of limiters includes a sum limiter configured to clamp an output of the load line circuit to a maximum value when the sensed voltage is at or above a maximum inflection point of the load line and to clamp the output of the load line circuit to a minimum value when the sensed voltage is at or below a minimum inflection point of the load line.

7. The voltage regulator according to claim 1, wherein the plurality of amplifiers includes:
   a first amplifier having a first gain;
   a second amplifier having a second gain; and
   a limiter coupled to an output of the second amplifier configured to clamp an output of the second amplifier to a voltage corresponding to a mid-inflection point of the load line; wherein:
   for sensed voltages below the mid-inflection point, an output of the first amplifier and an output of the second amplifier contribute to a slope of the load line; and wherein
   for sensed voltages above the mid-inflection point, only the output of the first amplifier contributes to the slope of the load line, the output of the second amplifier being clamped to a constant voltage by the limiter.

8. The voltage regulator according to claim 1, wherein the output voltage of the voltage regulator follows the load line in real time with a changing output current.

9. A method for implementing a load line in a voltage regulator, the method comprising:
  receiving a sensed voltage corresponding to an output current of the voltage regulator simultaneously at a first amplifier having a first gain and at a second amplifier having a second gain;
  amplifying the sensed voltage with a first amplifier to output a first slope-component signal;
  amplifying the sensed voltage with the second amplifier to output a second slope-component signal;
  clamping, using a first limiter, the second slope-component signal to a voltage corresponding to a mid-inflection point of the load line when the sensed voltage is above a threshold corresponding to a mid-inflection point, otherwise not clamping the second slope-component signal;
  summing the first slope-component signal and the second slope-component signal to form a load-line voltage;
  clamping, using a second limiter, the load-line voltage to a voltage corresponding to a minimum voltage of the load line when the sensed voltage is above a high-inflection point, otherwise not clamping the load-line voltage; and
  clamping, using a third limiter, the load-line voltage to zero volts when the sensed voltage is below a low-inflection point, otherwise not clamping the load-line voltage.

10. The method according to claim 9, further comprising:
  generating an error signal by subtracting a set voltage from a sum of the load-line voltage and an output voltage of the voltage regulator; and
  controlling the voltage regulator to adjust the output voltage so the error signal is zero.

11. The method according to claim 9, wherein the load-line voltage when plotted versus the sensed voltage has a zero portion, a slow slope portion, a fast slope portion, and a constant-voltage portion.

12. The method according to claim 11, wherein the slow slope portion and the fast slope portion approximate a nonlinear curve.

13. A load line circuit for a voltage regulator, comprising:
  a plurality of slope circuits that are coupled in parallel to simultaneously receive a sensed voltage corresponding to an output current of the voltage regulator, each slope circuit including an amplifier having a gain, the plurality of slope circuits configured to output a plurality of slope-component voltages;
  a summing circuit that adds the plurality of slope-component voltages and outputs a sum voltage; and
  a plurality of limiters that limit one or more of the plurality of slope-component voltages or the sum voltage, each limiter configured to clamp a voltage to a fixed value when a threshold condition for each limiter is met so that an output of the load line circuit is a load line voltage having a plurality of portions, each portion having a slope or a constant voltage that corresponds to a load line for the voltage regulator.

14. The load line circuit for a voltage regulator according to claim 13, wherein the plurality of slope circuits each include a limiter, of the plurality of limiters, that is coupled to an output of the amplifier of the slope circuit.

15. The load line circuit for a voltage regulator according to claim 14, wherein particular slope circuits of the plurality of slope circuits output a constant slope-component voltage when the threshold conditions for limiters of the particular slope circuits are met so that the sum voltage is not changed by the particular slope circuits as the sensed voltage is changed.

16. The load line circuit for a voltage regulator according to claim 13, wherein the plurality of slope circuits includes a first slope circuit without a limiter and a second slope circuit with a limiter, wherein a change in the sensed voltage changes the sum voltage (i) according to a first slope determined by the outputs of the first slope circuit and the second slope circuit when the limiter is not configured to clamp the output of the second slope circuit and (ii) according to a second slope determined by the output of the first slope circuit only when the limiter is configured to clamp the output of the second slope circuit.

17. The load line circuit for a voltage regulator according to claim 13, where the plurality of limiters includes (i) one or more slope limiters coupled to outputs of the amplifiers in the plurality of slope circuits and (ii) a sum limiter coupled to the output of the summing circuit.

18. The load line circuit for a voltage regulator according to claim 17, wherein the one or more slope limiters control the slope of the sum voltage versus the sensed voltage.

19. The load line circuit for a voltage regulator according to claim 18, wherein the sum limiter is configured to (i) clamp the sum voltage to a maximum value when a first threshold condition is met, (ii) clamp the sum voltage to a minimum value when a second threshold condition is met, and (iii) connect the sum voltage directly to the output of the load line circuit when neither the first threshold condition nor the second threshold condition is met.

20. The load line circuit for a voltage regulator according to claim 13, wherein one or both of the fixed values and threshold conditions of the limiters are adjustable to control a profile of the load line voltage versus the sensed voltage.

* * * * *